(12) United States Patent
Luo et al.

(10) Patent No.: US 12,225,674 B2
(45) Date of Patent: Feb. 11, 2025

(54) FOLDABLE DISPLAY DEVICE

(71) Applicants: Chengdu BOE Optoelectronics Technology Co., Ltd., Sichuan (CN); BOE Technology Group Co., Ltd., Beijing (CN)

(72) Inventors: Xuan Luo, Beijing (CN); Xiaoxia Huang, Beijing (CN); Ren Xiong, Beijing (CN); Bing Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/909,112

(22) PCT Filed: Nov. 8, 2021

(86) PCT No.: PCT/CN2021/129219
§ 371 (c)(1),
(2) Date: Sep. 2, 2022

(87) PCT Pub. No.: WO2022/227479
PCT Pub. Date: Nov. 3, 2022

(65) Prior Publication Data
US 2024/0260216 A1    Aug. 1, 2024

(30) Foreign Application Priority Data
Apr. 30, 2021   (CN) .......................... 202110482748.X

(51) Int. Cl.
*H05K 5/03* (2006.01)
*H05K 1/18* (2006.01)
*G06F 3/041* (2006.01)

(52) U.S. Cl.
CPC ............... *H05K 5/03* (2013.01); *H05K 1/189* (2013.01); *G06F 3/041* (2013.01); *G06F 2203/04102* (2013.01); *H05K 2201/10128* (2013.01)

(58) Field of Classification Search
CPC H05K 1/02; H05K 1/028; H05K 1/14; H05K 1/141–147; H05K 1/18;
(Continued)

(56) References Cited

U.S. PATENT DOCUMENTS 9,614,168 B2 * 4/2017 Zhang ................. H10K 59/131
10,520,978 B1   12/2019 Li et al.
(Continued)

FOREIGN PATENT DOCUMENTS

CN   108074487 A   5/2018
CN   207678070 U   7/2018
(Continued)

*Primary Examiner* — Tuan T Dinh
(74) *Attorney, Agent, or Firm* — IPro, PLLC

(57) ABSTRACT

Provided is a foldable display device. The foldable display device includes a flexible display panel, a flexible cover plate and a flexible printed circuit. The flexible display panel includes a first foldable region and a first side edge. The first foldable region includes a first sub-region, and a part of the first side edge is a boundary of the first sub-region. The flexible cover plate is bonded to a first surface of the flexible display panel and includes a second foldable region. An orthographic projection of the second foldable region on the first surface is within the first foldable region, the second foldable region is bonded to the first foldable region, and the orthographic projection of the second foldable region on the first surface is not overlapped with the first sub-region.

19 Claims, 7 Drawing Sheets

(58) Field of Classification Search
CPC ... H05K 1/187; H05K 5/00; H05K 5/02; H05K 5/0017; H05K 5/03; G06F 1/1641; G06F 1/1652; G06F 1/1656; G06F 3/041; H01L 27/32; H01L 27/323; H01L 27/3244; H01L 51/00; H01L 51/52
USPC .................. 361/749–750, 762, 795, 803; 174/254–258; 349/149–151
See application file for complete search history.

(56) References Cited

U.S. PATENT DOCUMENTS

| | | | | |
|---|---|---|---|---|
| 11,061,439 | B2* | 7/2021 | Kwon | ............... G06F 1/1656 |
| 11,417,848 | B2* | 8/2022 | Soh | ............... H10K 59/871 |
| 2014/0042406 | A1* | 2/2014 | Degner | ............... H05K 1/028 |
| | | | | 438/34 |
| 2018/0138442 | A1 | 5/2018 | Kim | |
| 2019/0200466 | A1* | 6/2019 | Kim | ............... G06F 1/1652 |
| 2019/0355927 | A1* | 11/2019 | Park | ............... H10K 50/8426 |
| 2019/0372051 | A1* | 12/2019 | Kwon | ............... H10K 59/87 |
| 2020/0012142 | A1 | 1/2020 | Kim et al. | |
| 2020/0084890 | A1 | 3/2020 | Jang et al. | |
| 2020/0196496 | A1 | 6/2020 | Shin | |
| 2020/0315015 | A1 | 10/2020 | Kim et al. | |
| 2020/0324521 | A1* | 10/2020 | Park | ............... B24B 7/24 |
| 2020/0337161 | A1* | 10/2020 | Choi | ............... B32B 27/281 |
| 2021/0028391 | A1* | 1/2021 | Yug | ............... B23K 26/402 |
| 2021/0076511 | A1* | 3/2021 | Yang | ............... H05K 5/0226 |
| 2021/0107826 | A1 | 4/2021 | Hwang et al. | |

FOREIGN PATENT DOCUMENTS

| | | |
|---|---|---|
| CN | 108766249 A | 11/2018 |
| CN | 109659344 A | 4/2019 |
| CN | 109872629 A | 6/2019 |
| CN | 110689819 A | 1/2020 |
| CN | 110880525 A | 3/2020 |
| CN | 111725280 A | 9/2020 |
| CN | 111754866 A | 10/2020 |
| CN | 111816073 A | 10/2020 |
| CN | 112670169 A | 4/2021 |

\* cited by examiner

FOLDABLE DISPLAY DEVICE

CROSS-REFERENCE TO RELATED APPLICATION

This application is a U.S. national stage of international application No. PCT/CN2021/129219, filed on Nov. 8, 2021, which claims priority to Chinese Patent Application No. 202110482748.X, filed on Apr. 30, 2021 and entitled "FOLDABLE DISPLAY DEVICE," the disclosures of which are herein incorporated by reference in their entireties.

TECHNICAL FIELD

The present disclosure relates to the field of display technologies, and in particular, relates to a foldable display device.

BACKGROUND

With the rise of foldable display devices, the foldable display technology has gained dramatic development. A foldable display device typically includes a flexible display panel, a flexible cover plate, and a flexible printed circuit (FPC). The flexible cover plate is bonded to a surface of the flexible display panel and protects the surface of the flexible display panel. A first side edge of the flexible display panel is bonded to the flexible printed circuit and the flexible printed circuit is bent from a front face of the flexible display panel to a rear face of the flexible display panel. The flexible cover plate shields the flexible printed circuit.

SUMMARY

Embodiments of the present disclosure provide a foldable display device. The technical solutions are as follows.

According to some embodiments of the present disclosure, a foldable display device is provided. The foldable display device includes: a flexible display panel including a first foldable region and a first side edge, wherein the first foldable region includes a first sub-region, and a part of the first side edge is a boundary of the first sub-region; a flexible cover plate bonded to a first surface of the flexible display panel and including a second foldable region, wherein an orthographic projection of the second foldable region on the first surface is within the first foldable region and is not overlapped with the first sub-region, and the second foldable region is bonded to the first foldable region; and a flexible printed circuit bonded to the first side edge, wherein an orthographic projection of the flexible printed circuit on the first surface is not overlapped with the second foldable region.

In some embodiments of the present disclosure, the flexible cover plate is provided with a notch in an edge thereof, the notch being disposed in an extending direction of the second foldable region; and the flexible printed circuit includes two first parts which are disposed on two sides of the first foldable region respectively in an extending direction of the first side edge; wherein on the first surface, orthographic projections of the two first parts are at least partially overlapped with orthographic projections of parts, on two sides of the notch respectively, of the flexible cover plate.

In some embodiments of the present disclosure, the width of the notch is greater than or equal to the width of the second foldable region, and the width of the notch and the width of the second foldable region are dimensions defined in the extending direction of the first side edge.

In some embodiments of the present disclosure, the orthographic projection of the flexible printed circuit on the first surface is not overlapped with an orthographic projection of the flexible cover plate on the first surface.

In some embodiments of the present disclosure, the foldable display device further includes: a housing including an annular baffle; wherein the annular baffle surrounds an edge of the flexible display panel, and the annular baffle and the flexible cover plate are disposed on a same side face of the flexible display panel; and a gap is defined between the annular baffle and the flexible display panel, the flexible printed circuit is disposed in the gap, and on the first surface, the orthographic projection of the flexible printed circuit is within an orthographic projection of the annular baffle.

In some embodiments of the present disclosure, a surface, distal from the flexible display panel, of the flexible cover plate is flush with a surface, distal from the flexible display panel, of the annular plate.

In some embodiments of the present disclosure, an inner edge of the annular baffle is attached to an edge of the flexible cover plate.

In some embodiments of the present disclosure, the foldable display device further includes: a first adhesive layer disposed between the flexible display panel and the flexible cover plate; wherein an orthographic projection of the first adhesive layer on the first surface is not overlapped with the orthographic projection of the flexible printed circuit on the first surface; and on a side where the first side edge is disposed, an edge of the first adhesive layer protrudes from an edge of the flexible cover plate, the first adhesive layer and the flexible cover plate forms a first step, and the annular baffle is provided with a second step matching the first step.

In some embodiments of the present disclosure, the width of a step surface of the first step ranges from 0.2 mm to 0.5 mm, and the width of the step surface is a dimension defined in a direction perpendicular to the extending direction of the first side edge and parallel to the first surface.

In some embodiments of the present disclosure, the housing further includes a bottom plate opposite to the annular baffle; and a side plate connected between an outer edge of the bottom plate and an outer edge of the annular baffle, wherein the annular baffle, the bottom plate and the side plate define an accommodation space, and the flexible display panel is disposed in the accommodation space.

In some embodiments of the present disclosure, the foldable display device further includes: a touch panel disposed between the flexible display panel and the flexible cover plate, wherein the touch panel includes a third foldable region and a second side edge, wherein the third foldable region includes a second sub-region, wherein a part of the second side edge is a boundary of the second sub-region, and the orthographic projection of the second foldable region on the first surface is within an orthographic projection of the third foldable region on the first surface, and is not overlapped with an orthographic projection of the second sub-region on the first surface; and a touch flexible printed circuit bonded to the second side edge, wherein an orthographic projection of the touch flexible printed circuit on the first surface is not overlapped with an orthographic projection of the third foldable region on the first surface.

In some embodiments of the present disclosure, two opposite surfaces of the touch panel are bonded to the touch flexible printed circuit.

In some embodiments of the present disclosure, the foldable display device further includes: a second adhesive layer disposed between the touch panel and the flexible display panel, wherein an orthographic projection of the second adhesive layer on the first surface is not overlapped with the orthographic projection of the touch flexible printed circuit on the first surface, and on a side where the second side edge is disposed, an edge of the touch panel protrudes from an edge of the second adhesive layer.

In some embodiments of the present disclosure, the flexible display panel further includes: a second surface, wherein the second surface and the first surface are two opposite surfaces of the flexible display panel; and the foldable display device further includes: a support plate including a third surface and a fourth surface opposite to each other, wherein the third surface is attached to the second surface, and the flexible printed circuit is bent to the fourth surface of the support plate.

In some embodiments of the present disclosure, the support plate is provided with a groove, wherein the groove extends from an edge of the fourth surface towards the middle of the fourth surface; and the foldable display device further includes a drive circuit disposed in the groove, wherein the flexible printed circuit is electrically connected to the drive circuit.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions and advantages of the present disclosure, embodiments of the present disclosure are described in further detail hereinafter with reference to accompanying drawings.

In a flexible display panel known to the inventors, a flexible printed circuit is bonded to a first side edge of a flexible display panel, and a region for bonding of the flexible printed circuit in the flexible display panel is not bonded to a flexible cover plate, that is, a folded region of the flexible cover plate includes a part which is not bonded to the flexible display panel. For an inwards-folded-type foldable display device (the flexible cover plate is on an inner side after folding), when the foldable display device is bent, the part of the flexible cover plate that is not bonded to the flexible display panel is also bent, and the flexible cover plate is squeezed upon bending. As a result, the part of the flexible cover plate which is not bonded to the flexible display panel and is bent suffers from wrinkles.

Figure 1:
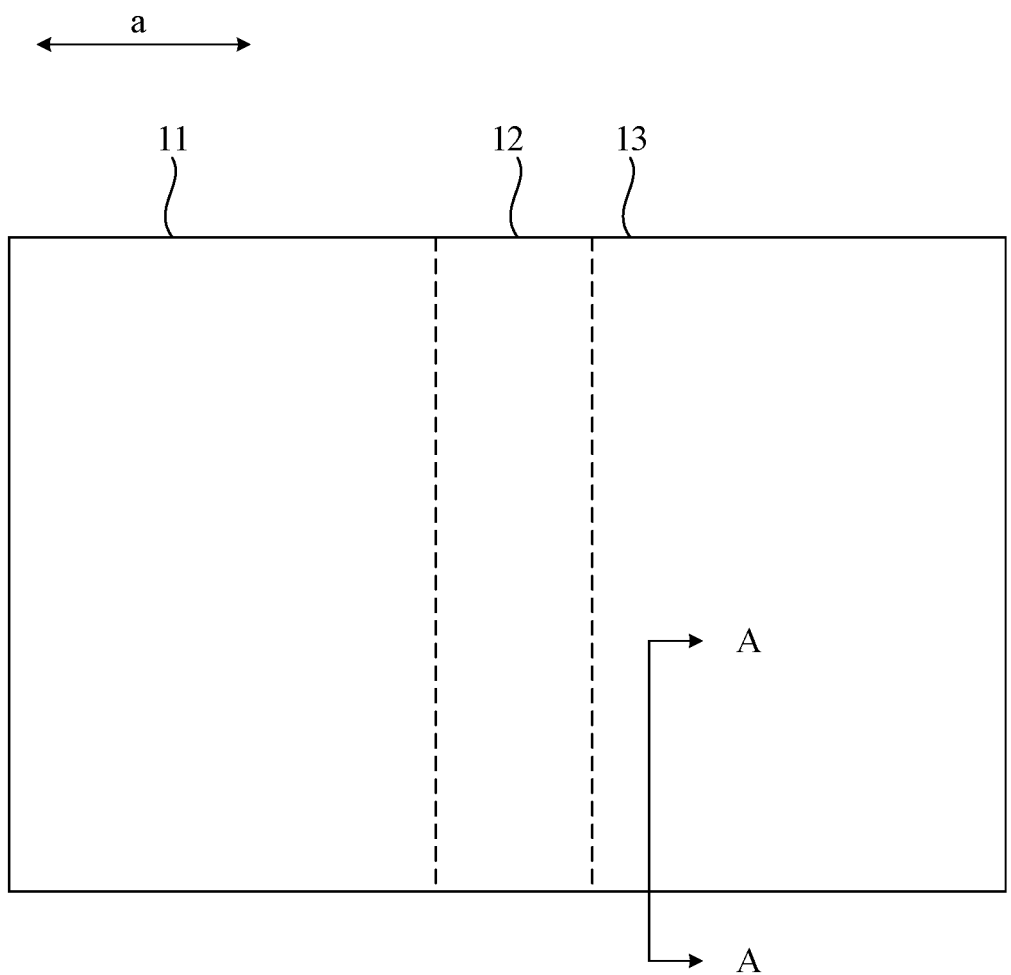
FIG. 1 is a top view of a foldable display device in a flat state according to some embodiments of the present disclosure.

FIG. 1 is a top view of a foldable display device in a flat state according to some embodiments of the present disclosure. Referring to FIG. 1, the foldable display device includes a first plane display region 11, a bendable display region 12, and a second plane display region 13, which are connected in sequence in a first direction a. When the foldable display device is in the flat state, a surface of the first plane display region 11, a surface of the bendable display region 12, and a surface of the second plane display region 13 are all in a same plane. The display device switches from the flat state to a bent state when being bent at the bendable display region 12. In this case, the first plane display region 11 is opposite to the second plane display region 13.

Figure 2:
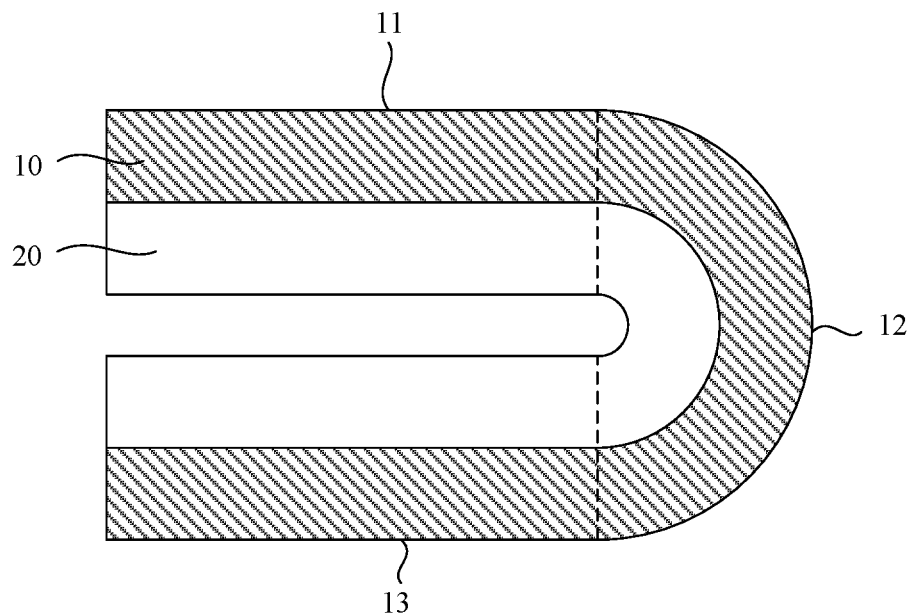
FIG. 2 is a side view of the foldable display device in a bent state according to some embodiments of the present disclosure.

The foldable display device according to the embodiments of the present disclosure is an inwards-folded-type foldable display device. FIG. 2 is a side view of the foldable display device in a bent state according to some embodiments of the present disclosure. Referring to FIG. 2, the foldable display device includes a flexible display panel 10 and a flexible cover plate 20 which are stacked. When the inwards-folded-type foldable display device is in the bent state, the flexible cover plate 20 is on an inner side of a bent part, such that the flexible cover plate 20 is subject to a bending pressure, and thus wrinkles are easily generated during bending of the flexible cover plate 20 when being subject to the pressure due to a soft material of the flexible cover plate 20.

In other embodiments, the foldable display device is an outwards-folded-type foldable display device. When the outwards-folded-type foldable display device is in a folded state, the flexible cover plate is on an outer side of a bent part.

Figure 3:
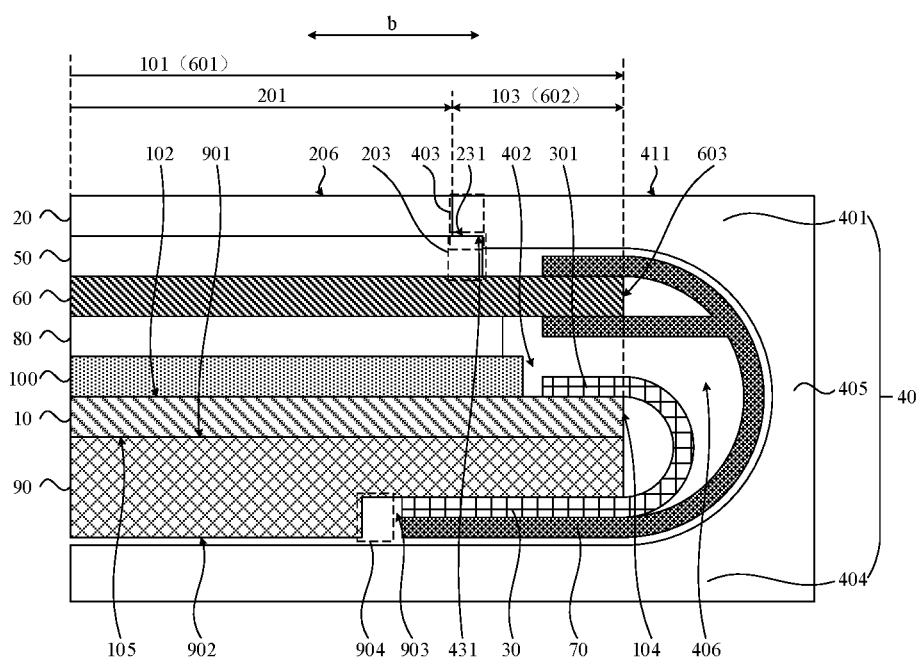
FIG. 3 is a sectional view taken along a plane A-A in FIG. 1.

FIG. 3 is a sectional view taken along a plane A-A in FIG. 1. Referring to FIG. 3, the foldable display device includes a flexible display panel 10, a flexible cover plate 20, and a flexible printed circuit 30. The flexible display panel 10 includes a first foldable region 101 and a first side edge 104. The first foldable region 101 includes a first sub-region 103, and a part of the first side edge 104 is a boundary of the first sub-region 103. The flexible cover plate 20 is bonded to a first surface 102 of the flexible display panel 10. The flexible cover plate 20 includes a second foldable region 201. An orthographic projection of the second foldable region 201 on the first surface 102 is within the first foldable region 101, the second foldable region 201 is bonded to the first foldable region 101, and the orthographic projection of the second foldable region 201 on the first surface 102 is not overlapped with the first sub-region 103. The flexible printed circuit 30 is bonded to the first side edge 104 of the flexible display panel 10, and an orthographic projection of the flexible printed circuit 30 on the first surface 102 is not overlapped with the second foldable region 201.

In the embodiments of the present disclosure, the first sub-region of the first foldable region is not overlapped with the orthographic projection of the second foldable region on the first surface and the orthographic projection of the flexible printed circuit on the first surface is not overlapped with the second foldable region, that is, the second foldable region of the flexible cover plate is retracted inwards, such that the second foldable region of the flexible cover plate is completely bonded to the first foldable region. Therefore, when being bent, the flexible cover plate is prevented from causing wrinkles due to bending as the folded region of the flexible cover plate is subject to an adhesive force, which addresses the problem that wrinkles are generated in the flexible cover plate during bending.

In the embodiments of the present disclosure, the orthographic projection of the flexible printed circuit 30 on the first surface 102 is not overlapped with the first foldable region 101, that is, a bent part of the flexible display panel 10 is not bonded to the flexible printed circuit 30, such that the flexible printed circuit 30 is prevented from being damaged during bending.

In the flexible display panel known to the inventors, since wrinkles are generated in the flexible cover plate 20 during bending, the flexible cover plate 20 is disengaged from the flexible display panel 10. The foldable display panel according to the embodiments of the present disclosure addresses the problem that wrinkles are generated in the flexible cover plate 20 during bending, and also addresses the problem of disengagement of the flexible cover plate 20 from the flexible display panel 10 effectively.

Figure 4:
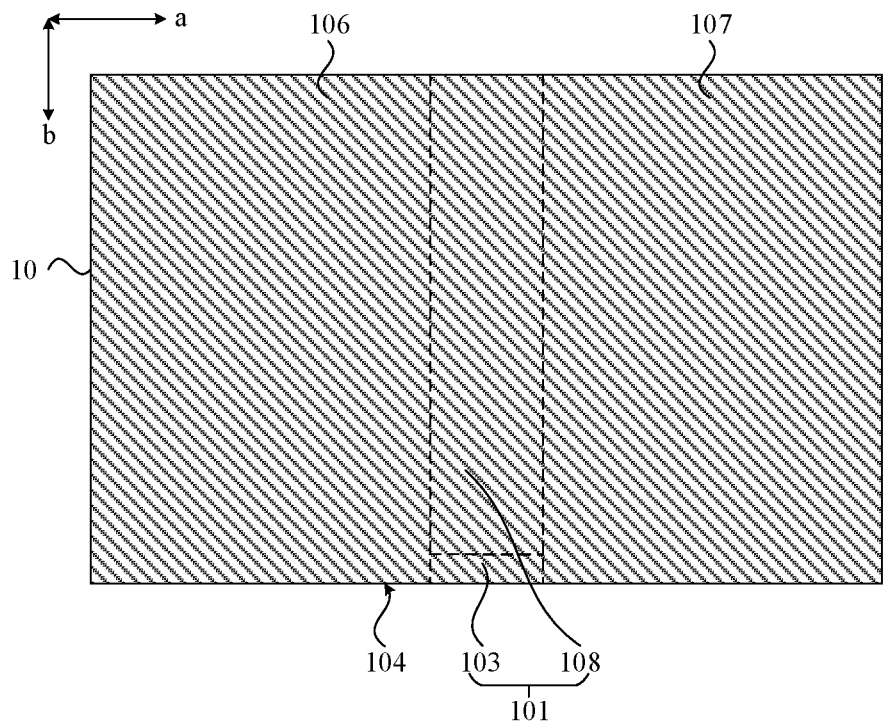
FIG. 4 is a top view of a flexible display panel according to some embodiments of the present disclosure.

FIG. 4 is a top view of a flexible display panel according to some embodiments of the present disclosure. Referring to FIG. 4, the first foldable region 101 is rectangular and the boundary of the first sub-region 103 is a part of the first side edge 104. The flexible display panel 10 further includes a first plane region 106 and a second plane region 107, which are disposed on two sides of the first foldable region 101 respectively along the first direction a. The first foldable region 101 is opposite to the bendable display region 12, the first plane region 106 is opposite to the first plane display region 11, and the second plane region 107 is opposite to the second plane display region 13.

As shown in FIG. 4, the first foldable region 101 further includes a third sub-region 108. The third sub-region 108 and the first sub-region 103 constitute the first foldable region 101. In addition, on the first surface 102, the orthographic projection of the second foldable region 201 is overlapped with the third sub-region 108.

In the embodiments of the present disclosure, the flexible display panel 10 is a flexible OLED display panel 10.

Figure 5:
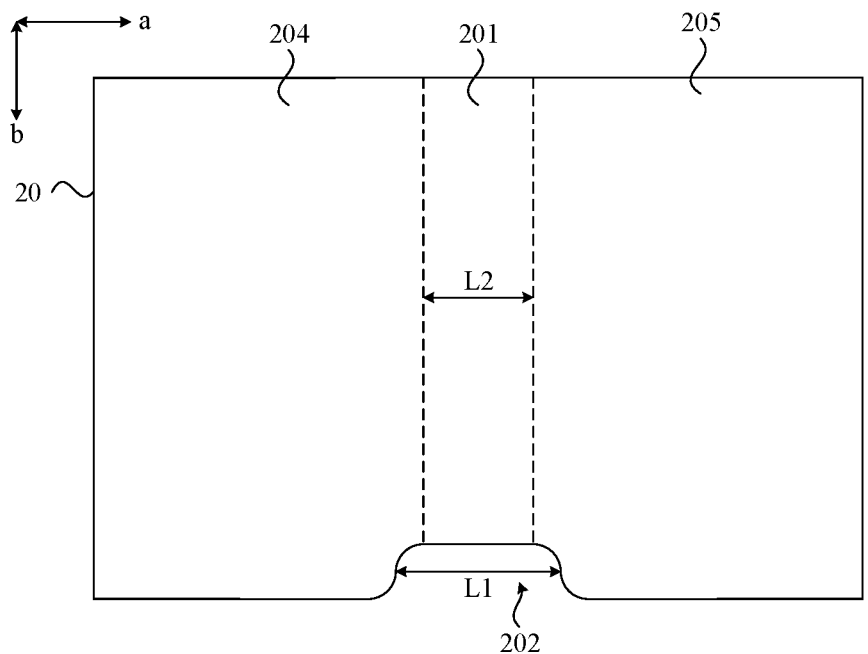
FIG. 5 is a top view of a flexible cover plate according to some embodiments of the present disclosure.

FIG. 5 is a top view of a flexible cover plate according to some embodiments of the present disclosure. Referring to FIG. 5, the flexible display panel 20 further includes a third plane region 204 and a fourth plane region 205, which are disposed on two sides of the second foldable region 201 respectively along the first direction a. The second foldable display region 201 is opposite to the bendable display region 12, the third plane region 204 is opposite to the first plane display region 11, and the fourth plane region 205 is opposite to the second plane display region 13.

In the embodiments of the present disclosure, the flexible cover plate 20 is a polyimide (PI) cover plate or a colorless polyimide (CPI) cover plate so as to ensure the flexibility and transparency of the flexible cover plate 20.

Referring to FIG. 5 again, the flexible cover plate 20 is provided with a notch 202 on an edge thereof, and the notch 202 is disposed in an extending direction b of the second foldable region 201, such that the flexible cover plate 20 is concave. In FIG. 5, the second foldable region 201 is rectangular, the notch 202 takes the shape of a rounded rectangle, and one edge of the second foldable region 201 is a part of one edge of the notch 202. As the notch 202 is arranged to take the shape of the rounded rectangle, stress concentration on edges of the notch 202 is alleviated.

Figure 6:
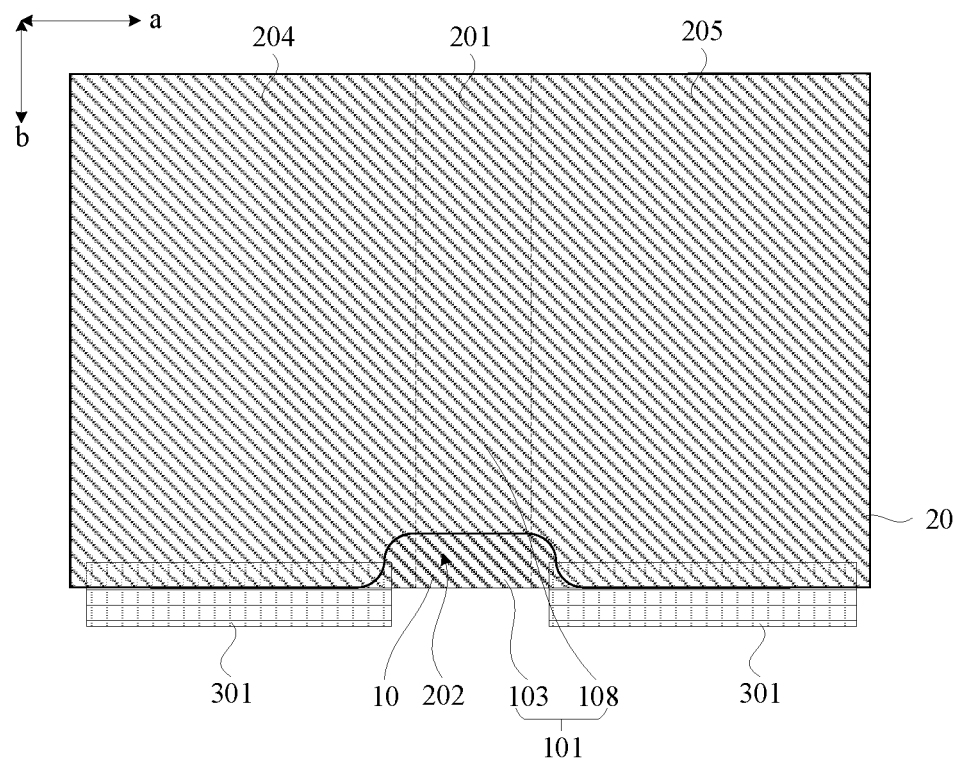
FIG. 6 is a top view showing assembly of the flexible display panel, the flexible cover plate and a flexible printed circuit according to some embodiments of the present disclosure.

FIG. 6 is a top view showing assembly of a flexible display panel, a flexible cover plate and a flexible printed circuit according to some embodiments of the present disclosure. The flexible display panel 10 in FIG. 6 is that shown in FIG. 4 and the flexible cover plate 20 in FIG. 6 is that shown in FIG. 5. Referring to FIG. 6, the flexible printed circuit 30 includes two first parts 301. In the first direction a, the two first parts 301 are disposed on two sides of the first foldable region 101 respectively. On the first surface 102, orthographic projections of the two first parts 301 are at least partially overlapped with orthographic projections of parts, on two sides of the notch 202 respectively, of the flexible cover plate 20.

When being bent, the flexible cover plate 20 suffers from a higher bending pressure in the second foldable region 201, and thus wrinkles are generated in the flexible cover plate 20 due to the bending pressure. Therefore, the flexible cover plate 20 needs to be bonded to the flexible display panel 10. In addition, the flexible cover plate 20 suffers from a very low pressure in the third plane region 204 and the fourth panel region 205, which is ignored. Therefore, wrinkles are not generally generated in the flexible cover plate 20 in the third plane region 204 and the fourth panel region 205.

In the embodiments of the present disclosure, a part of the flexible cover plate 20 in the second foldable region 201 is retracted inwards, such that the second foldable region 201 of the flexible cover plate 20 is completely bonded to the flexible display panel 10. This not only ensures that no wrinkles are generated in the flexible cover plate 20 during bending, but also ensures that the flexible cover plate 20 has a relatively large area and protects the surface of the flexible display panel 10 compared with the situation that an entire side edge of the flexible cover plate 20 is retracted. Moreover, the orthographic projection of the flexible printed circuit 30 is partially overlapped with the orthographic projection of the flexible cover plate 20, such that the flexible printed circuit 30 is shielded in the third plane region 204 and the fourth plane region 205 of the flexible cover plate 20 to protect the flexible printed circuit 30 and the flexible display panel 10.

In some possible embodiments, the flexible printed circuit 30 includes at least two circuit boards. In the first direction a, the at least two circuit boards are disposed on two sides of the first foldable region 101 respectively. All circuit boards on one side of the first foldable region 101 constitute one first part 301, and all circuit boards on the other side of the first foldable region 101 constitute the other first part 301. In some possible embodiments, the flexible printed circuit 30 includes one circuit board. For example, the circuit board is Y-shaped. The Y-shaped circuit board has two branches. One ends of the two branches are bonded to the flexible display panel 10 respectively, the other ends of the two branches are connected to each other, and the two branches of the flexible printed circuit 30 are two first parts 301 respectively.

Referring to FIG. 5 and FIG. 6 again, the width L1 of the notch 202 is greater than the width L2 of the second foldable region 201, and the width L1 of the notch 202 and the width L2 of the second foldable region 201 are dimensions defined in an extending direction of the first side edge 104. The extending direction of the first side edge 104 is consistent with the first direction a. At this time, the two first parts 301 is partially in the notch 202.

In the embodiments of the present disclosure, the width L1 of the notch 202 is greater than the width L2 of the second foldable region 201, and thus the flexible cover plate 20 is prevented from causing wrinkles or warping at an intersection of the notch 202 and the second foldable region 201.

In other embodiments, the width L1 of the notch 202 is equal to the width L2 of the second foldable region 201, such that the width L1 of the notch 202 is minimum and the area of the flexible cover plate 20 is maximum. This further improves the protection effect of the flexible cover plate 20 on the surface of the flexible display panel 10. At this time, on the first surface 102, orthographic projections of the two first parts 301 are within orthographic projections of parts, on two sides of the notch 202 respectively, of the flexible cover plate 20.

In an exemplary embodiment, a difference between the width of the notch 202 and the width of the second foldable region 201 ranges from 0 mm to 5 mm.

In the embodiments of the present disclosure, the notch 202 takes the shape of a right-angled rectangle or a trapezoid.

The flexible cover plate 20 shown in each of FIG. 5 and FIG. 6 is provided with one notch 202, and as shown in FIG. 6, one side edge of the flexible display panel 10 is bonded to the flexible printed circuit 30. In other embodiments, two or more side edges of the flexible display panel 10 is bonded to the flexible printed circuit 30.

Figure 7:
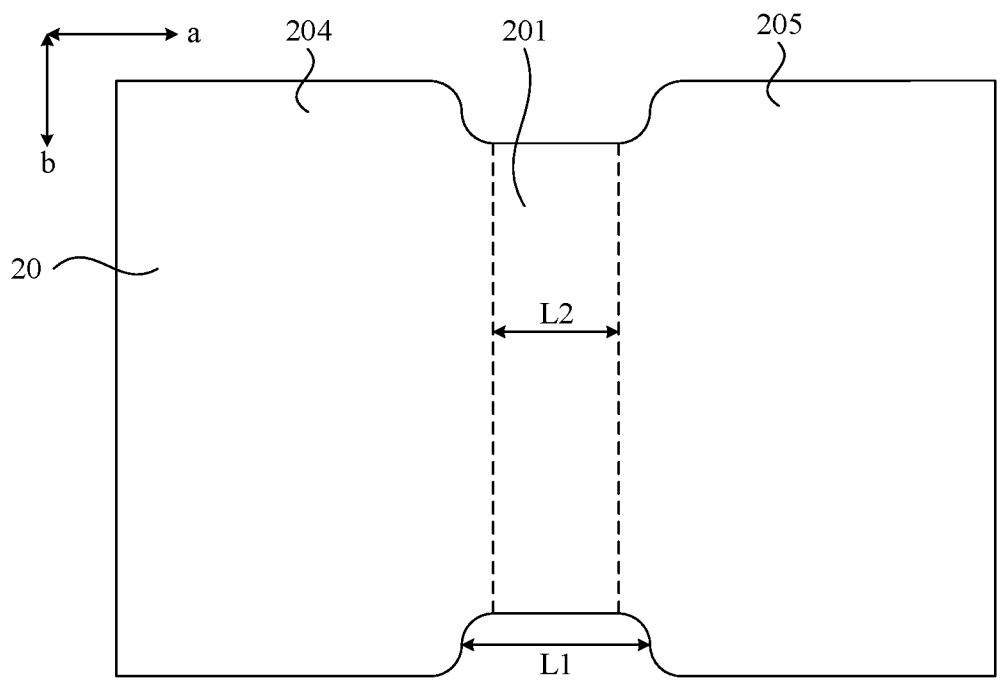
FIG. 7 is a top view of another flexible cover plate according to some embodiments of the present disclosure.

FIG. 7 is a top view of another flexible cover plate according to some embodiments of the present disclosure. Referring to FIG. 7, the flexible cover plate 20 is provided with two notches 202 on edges thereof, and in the extending direction b of the second foldable region 201, the two notches 202 are disposed on two sides of the second foldable region 201 respectively.

Figure 8:
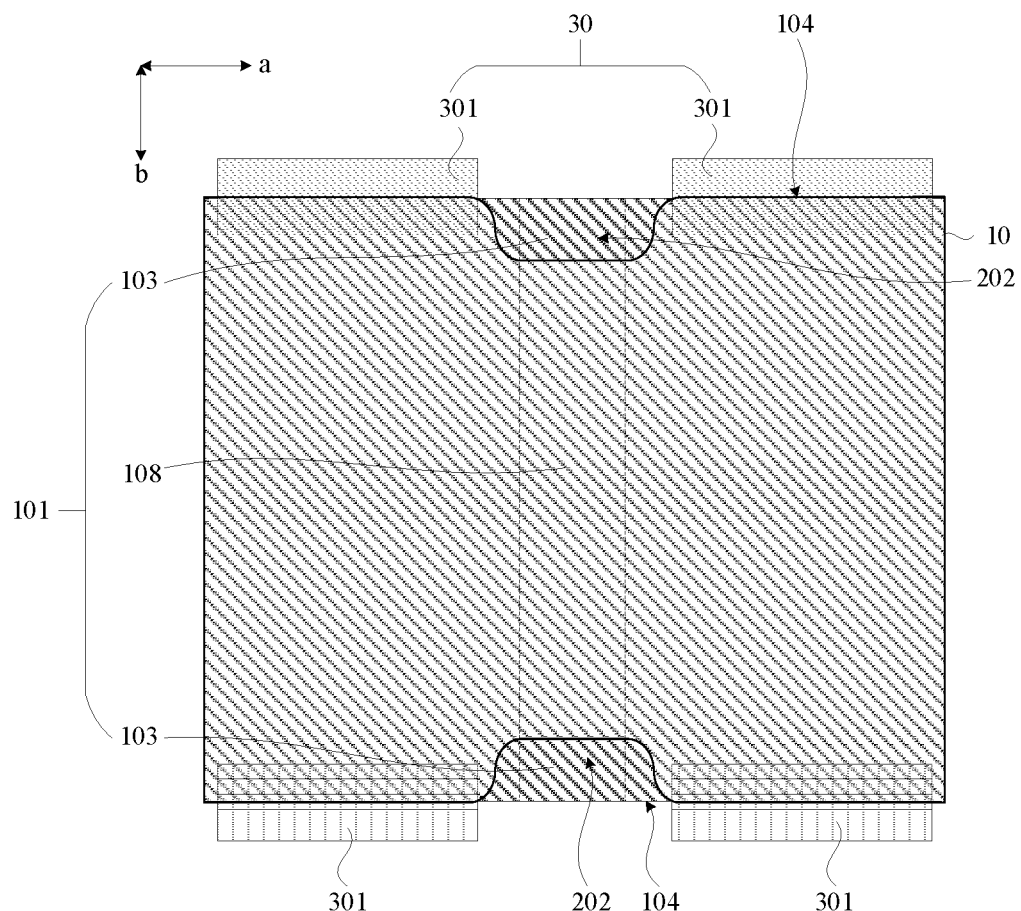
FIG. 8 is a top view showing another assembly of the flexible display panel, the flexible cover plate and the flexible printed circuit according to some embodiments of the present disclosure.

FIG. 8 is a top view showing another assembly of a flexible display panel, a flexible cover plate and a flexible printed circuit according to some embodiments of the present disclosure. The flexible display panel 10 in FIG. 8 is that shown in FIG. 4 and the flexible cover plate 20 in FIG. 8 is that shown in FIG. 7. Referring to FIG. 8, the flexible display panel 10 is provided with two first side edges 104, wherein each of the two first side edges 104 is bonded to the flexible printed circuit 30.

The flexible cover plate 20 shown in each of FIG. 5 and FIG. 8 is provided with a notch 202, and the orthographic projection of the flexible printed circuit 30 is partially overlapped with the orthographic projection of the flexible cover plate 20. In other embodiments, the flexible cover plate 20 is provided with no notch, and the orthographic projection of the flexible printed circuit 30 is not overlapped with the orthographic projection of the flexible cover plate 20.

Figure 9:
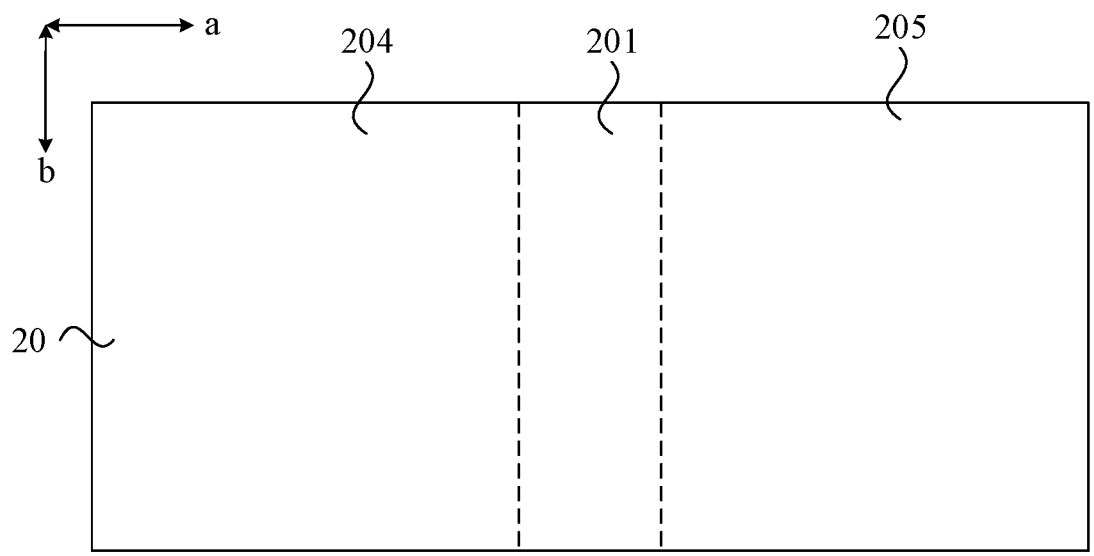
FIG. 9 is a top view of still another flexible cover plate according to some embodiments of the present disclosure.

FIG. 9 is a top view of still another flexible cover plate according to some embodiments of the present disclosure. Referring to FIG. 9, the flexible cover plate 20 is provided with no notch. In addition, the dimension of the second foldable region 201 in the flexible cover plate 20 shown in FIG. 9 is equal to that of the second foldable region 201 in the flexible cover plate 20 shown in FIG. 5. Edges of the third plane region 204 and of the fourth plane region 205 are retracted inwards, such that the edges of the third plane region 204 and of the fourth plane region 205 are flush with an edge of the second foldable region 201.

Figure 10:
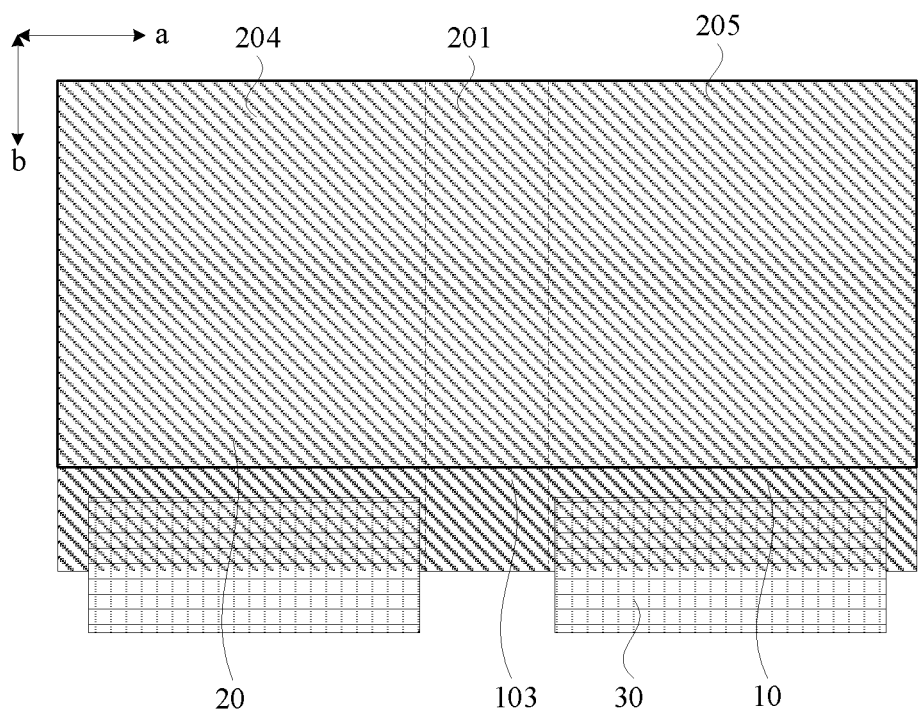
FIG. 10 is a top view showing still another assembly of the flexible display panel, the flexible cover plate and the flexible printed circuit according to some embodiments of the present disclosure.

FIG. 10 is a top view showing still another assembly of a flexible display panel, a flexible cover plate and a flexible printed circuit according to some embodiments of the present disclosure. Referring to FIG. 10, the orthographic projection of the flexible printed circuit 30 on the first surface 102 is not overlapped with the orthographic projection of the flexible cover plate 20) on the first surface 102. The flexible display panel 10 in FIG. 10 is that shown in FIG. 4 and the flexible cover plate 20 in FIG. 10 is that shown in FIG. 9.

In the embodiments of the present disclosure, the entire side edge of the flexible cover plate 20 is retracted inwards, such that the entire surface of the flexible cover plate 20 is bonded to the flexible display panel 10, and when being bent, the flexible cover plate 20 is subject to an adhesive force, and thus is prevented from causing wrinkles due to bending.

Referring to FIG. 3 again, the foldable display device further includes a housing 40. The housing 40 includes an annular baffle 401. The annular baffle 401 surrounds an edge of the flexible display panel 10, and the annular baffle 401 and the flexible cover plate 20 are disposed on the same side face of the flexible display panel 10. A gap 402 is defined between the annular baffle 401 and the flexible display panel 10, the flexible printed circuit 30 is disposed in the gap 402, and on the first surface 102, the orthographic projection of the flexible printed circuit 30 is in an orthographic projection of the annular baffle 401. The housing 40 is a middle frame or an outer shell of the foldable display device. A part of the flexible printed circuit 30 bonded to the flexible display panel 10 is disposed in the gap 402.

As the flexible cover plate 20 is not able to completely shield the flexible printed circuit 30 after being inwards retracted and exposes a part of the flexible printed circuit 30, the appearance of the display device is adversely affected. Furthermore, the exposed part of the flexible printed circuit 30 is damaged more easily due to no shielding compared with the shielded part. In the embodiments of the present disclosure, the housing 40 is arranged, the gap 402 between the annular baffle 401 and the flexible display panel 10 is configured for arrangement of the flexible printed circuit 30, and the orthographic projection of the flexible printed circuit 30 is disposed in the orthographic projection of the annular baffle 401. Thus, the annular baffle 401 is capable of shielding the flexible printed circuit 30, such that the appearance of the display device is prevented from being adversely affected; and the flexible printed circuit 30 is protected such that the possibility of damages to the flexible printed circuit 30 is lowered. The annular baffle 401 is a part of the housing 40 and has a high material strength. Wrinkles are not easily generated during bending.

In the embodiments of the present disclosure, the housing 40 is a metal housing and thus the strength of the housing 40 is ensured. When the foldable display device is bent, the housing 40) is also bent. However, during bending, wrinkles are not easily generated because the metal has bending performance and has a high strength.

Alternatively, in other embodiments, the housing 40 is a plastic housing, and the foldable display device is lightened due to the low density of the plastic.

Referring to FIG. 3 again, the housing 40 further includes a bottom plate 404 and a side plate 405. The bottom plate 404 is opposite to the annular baffle 401. The side plate 405 is connected between an outer edge of the bottom plate 404 and an outer edge of the annular baffle 401. The annular baffle 401, the bottom plate 404 and the side plate 405 define an accommodation space 406, wherein the flexible display panel 10 is disposed in the accommodation space 406. Typically, the housing 40 includes a plurality of side plates 405, wherein the plurality of side plates 405 are connected to the bottom plate 404 and the annular baffle 401.

In the embodiments of the present disclosure, the annular baffle 401, the bottom plate 404, and the side plate 405 define the accommodation space 406, wherein the flexible display panel 10 is disposed in the accommodation space 406, such that the side edge of the flexible display panel 10 is protected and prevented from being damaged due to collision.

Referring to FIG. 3 again, a surface 206, distal from the flexible display panel 10, of the flexible cover plate 20 is flush with a surface 411, distal from flexible display panel 10, of the annular plate 401.

In the embodiments of the present disclosure, the surface 411 of the annular plate 401 is flush with the surface 206 of the flexible cover plate 20, which ensures the surface smoothness of the foldable display device. In addition, compared with the flexible display panel known to the inventors in which the annular baffle 401 is arranged on the flexible cover plate 20, the structure of the foldable display device according to the embodiments of the present disclosure decreases the thickness of the housing 40 and also decreases the thickness of the foldable display device, which is conducive to thinning of the foldable display device.

Referring to FIG. 3 again, an inner edge of the annular baffle 401 is attached to an edge of the flexible cover plate 20.

In the embodiments of the present disclosure, the inner edge of the annular baffle 401 is attached to the edge of the flexible cover plate 20, such that the annular baffle 401 and the flexible cover plate 20 covers the surface of the flexible display panel 10 completely, thereby improving the protection effect on the surface of the flexible display panel 10.

Referring to FIG. 3 again, the foldable display device further includes a first adhesive layer 50. The first adhesive layer 50 is disposed between the flexible display panel 10 and the flexible cover plate 20. The first adhesive layer 50 bonds the flexible display panel 10 to the flexible cover plate 20.

In an exemplary embodiment, the first adhesive layer 50 is an optically clear adhesive (OCA) layer or a foam adhesive layer.

In the embodiments of the present disclosure, an orthographic projection of the first adhesive layer 50 on the first surface 102 is not overlapped with the orthographic projection of the flexible printed circuit 30 on the first surface 102, such that the first adhesive layer 50 is prevented from covering the flexible printed circuit 30 to affect the performance of the flexible printed circuit 30.

Referring to FIG. 3 again, on a side where the first side edge 104 is disposed, an edge of the first adhesive layer 50 protrudes from an edge of the flexible cover plate 20, the first adhesive layer 50 and the flexible cover plate 20 forms a first step 203, and the annular baffle 401 is provided with a second step 403 matching the first step 203.

In the embodiments of the present disclosure, the first adhesive layer 50 and the flexible cover plate 20 forms the first step 203, and thus a step surface 231 of the first step 203 is a part of a surface of the first adhesive layer 50 and has adhesion; and a step surface 431 of the second step 403 is attached to the step surface 231 of the first step 203, thereby bonding the annular baffle 401 to the flexible display panel 10 and enhancing the stability of the housing 40.

In the embodiments of the present disclosure, for the flexible cover plate 20 shown in each of FIG. 5 and FIG. 6, the second foldable region 201 of the flexible cover plate 20 is completely bonded to the flexible display panel 10 via the first adhesive layer 50, and a part of the flexible cover plate 20 opposite to the flexible printed circuit 30 is not bonded to the flexible display panel 10 via the first adhesive layer 50. That is, only at the notch 202, the edge of the first adhesive layer 50 protrudes from the edge of the flexible cover plate 20.

For the flexible cover plate 20 shown in each of FIG. 9 and FIG. 10, the flexible cover plate 20 is completely bonded to the flexible display panel 10 via the first adhesive layer 50. On the side where the first side edge 104 is disposed, the edge of the entire side edge of the first adhesive layer 50 protrudes from the edge of the flexible cover plate 20.

In the embodiments of the present disclosure, the width of the step surface 231 of the first step 203 ranges from 0.2 mm to 0.5 mm, and the width of the step surface 231 is a dimension defined in a direction perpendicular to the extending direction of first side edge 104 and parallel to the first surface 102.

By limiting the width of the step surface 231 of the first step 203 within the range of 0.2 mm to 0.5 mm, the step surface 231 of the first step 203 is bonded to the annular baffle 401, and an enough region is reserved on the first side edge 104 of the flexible display panel 10 to be bonded to the flexible printed circuit 30.

Referring to FIG. 3 again, the foldable display device further includes a touch panel (TP) 60 and a touch flexible printed circuit (TFPC) 70. The touch panel 60 is disposed between the flexible display panel 10 and the flexible cover plate 20. The touch panel 60 includes a third foldable region 601 and a second side edge 603. The third foldable region 601 includes a second sub-region 602, and a part of the second side edge 603 is a boundary of the second sub-region 602. The orthographic projection of the second foldable region 201 on the first surface 102 is within an orthographic projection of the third foldable region 601 on the first surface 102, and is not overlapped with an orthographic projection of the second sub-region 602 on the first surface 102. The touch flexible printed circuit 70 is bonded to the second side edge 603 of the touch panel 60, and an orthographic projection of the touch flexible printed circuit 70 on the first surface 102 is not overlapped with the orthographic projection of the third foldable region 601 on the first surface 102.

It should be noted that in the sectional view of FIG. 3, the third foldable region 601 is overlapped with the first foldable region 101 and the second sub-region 602 is overlapped with the first sub-region 103. However, the first foldable region 101 and the first sub-region 103 are parts of the flexible display panel 10 and the third foldable region 601 and the second sub-region 602 is a part of the touch panel 60.

By arranging the touch panel 60 and the touch flexible printed circuit 70 in the foldable display device, the foldable display device implements a touch function.

Furthermore, the orthographic projection of the second sub-region 602 of the third foldable region 601 on the first surface 102 is not overlapped with the orthographic projection of the second foldable region 201 on the first surface 102, and the orthographic projection of the touch flexible printed circuit 70 on the first surface 102 is not overlapped with the orthographic projection of the third foldable region 601 on the first surface 102. That is, the folded region of the flexible cover plate 20 is completely bonded to the touch panel 60 and does not extend into a region, bonded to the flexible printed circuit 70, of the touch panel 60, and the region, bonded to the flexible printed circuit 70, of the touch panel 60 should not be bonded to the flexible cover plate 20. Therefore, when being bent, the flexible cover plate 20 is prevented from causing wrinkles due to bending as the folded region of the flexible cover plate 20 is subject to an adhesive force, which addresses the problem that the flexible cover plate 20 is subject to the wrinkles when being bent.

In the embodiments of the present disclosure, the orthographic projection of the touch flexible printed circuit 70 on the first surface 102 is not overlapped with the orthographic projection of the third foldable region 601 on the first surface 102, that is, a folded part of the touch panel 60 is bonded to no touch flexible printed circuit 70, thereby preventing the touch flexible printed circuit 70 from being damaged during bending.

Referring to FIG. 3 again, the two opposite surfaces of the touch panel 60 are bonded to the touch flexible printed circuit 70, thereby increasing the bonding area between the touch panel 60 and the touch flexible printed circuit 70.

Referring to FIG. 3 again, the foldable display device further includes a second adhesive layer 80. The second adhesive layer 80 is disposed between the touch panel 60 and the flexible display panel 10 and bonds the flexible display panel 10 to the touch panel 60, and at this time, the first adhesive layer 50 bonds the touch panel 60 to the flexible cover plate 20.

In an exemplary embodiment, the second adhesive layer 80 is an optically clear adhesive layer or a foam adhesive layer.

In some embodiments of the present disclosure, an orthographic projection of the second adhesive layer 80 on the first surface 102 is not overlapped with the orthographic projection of the touch flexible printed circuit 70 on the first surface 102, such that the second adhesive layer 80 is prevented from covering the touch flexible printed circuit 70 to affect the performance of the touch flexible printed circuit 70.

Referring to FIG. 3 again, on the second side edge 603, an edge of the touch panel 60 protrudes from an edge of the second adhesive layer 80.

In the embodiments of the present disclosure, the two opposite surfaces of the touch panel 60) are bonded to the touch flexible printed circuit 70 and the second adhesive layer 80 is disposed between the touch panel 60 and the flexible display panel 10. On the side where the second side edge 603 is disposed, the dimension of the second adhesive layer 80 is decreased, and an enough region is reserved in the touch panel 60 to be bonded to the touch flexible printed circuit 70, thereby facilitating the bonding of the touch panel 60 and the touch flexible printed circuit 70.

Referring to FIG. 3 again, the foldable display device further includes a polarizer (POL) 100. The polarizer 100 is disposed between the flexible display panel 10 and the second adhesive layer 80 and is configured to change a polarization direction of polarized light to ensure that the foldable display device is able to display pictures.

As shown in FIG. 3, due to inward retraction of the second adhesive layer 80, on the side where the second side edge 603 is disposed, an edge of the polarizer 100 protrudes from the edge of the second adhesive layer 80, that is, the edge of the second adhesive layer 80 is retracted inwards.

In the embodiments of the present disclosure, in the extending direction b of the second foldable region 201, the edge of the polarizer 100 protrudes from the edge of the second adhesive layer 80 by 0.2 mm to 0.5 mm, which not only facilitates the bonding of the touch panel 60 and the touch flexible printed circuit 70, but also prevents the following situation: the bonding of the touch panel 60 and the flexible display panel 10 is adversely affected due to a very small area of the second adhesive layer 80 arising from too much inward retraction of the second adhesive layer 80.

Referring to FIG. 3 again, in the extending direction b of the second foldable region 201, a gap is defined between the flexible printed circuit 30 and the polarizer 100 and is a manufacturing tolerance.

In a film layer diagram shown in FIG. 3, the edge of the first adhesive layer 50 is not flush with the edge of the flexible cover plate 20, and the edge of the polarizer 100 is not flush with the edge of the second adhesive layer 80.

Figure 11:
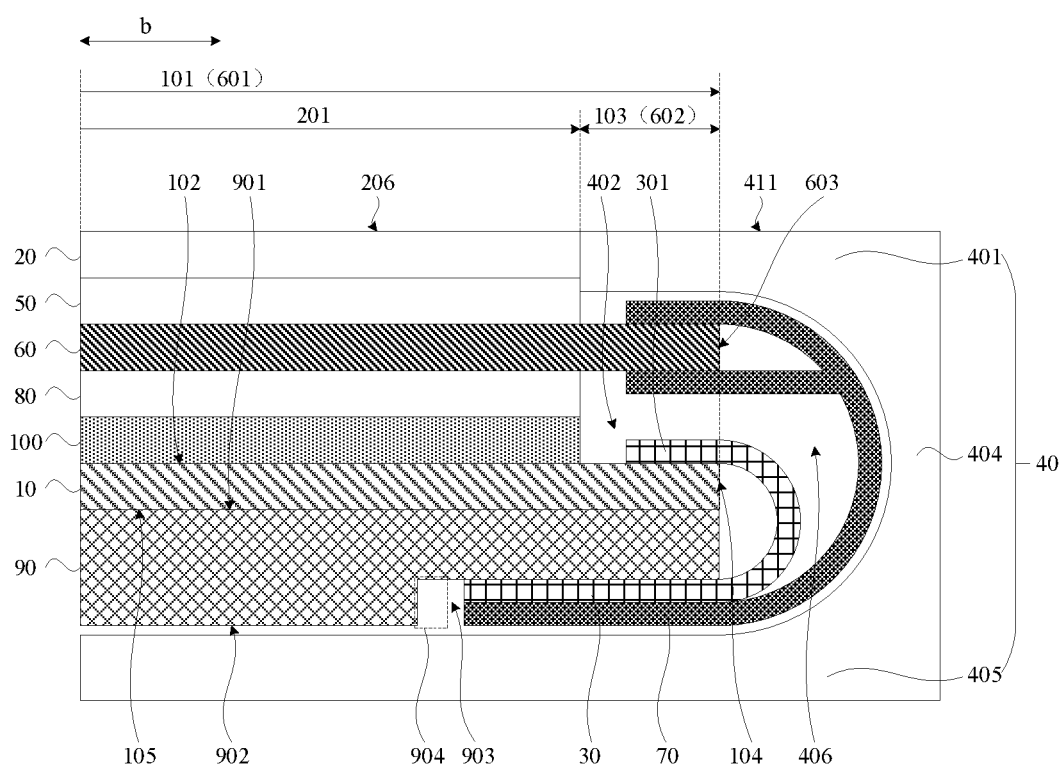
FIG. 11 is a structural diagram of a foldable display device according to some embodiments of the present disclosure.

FIG. 11 is a structural schematic diagram of a foldable display device according to some embodiments of the present disclosure. Referring to FIG. 11, the structure shown in FIG. 11 differs from that shown in FIG. 3 in that the edge of the first adhesive layer 50 is flush with the edge of the flexible cover plate 20, and the edge of the polarizer 100 is flush with the edge of the second adhesive layer 80.

In the embodiments of the present disclosure, after the flexible display panel 10, the polarizer 100, the second adhesive layer 80, the touch panel 60, the first adhesive layer 50, and the flexible cover plate 20 are bonded together, on the side where no flexible printed circuit 30 and no touch flexible printed circuit 70 are arranged, the flexible display panel 10, the polarizer 100, the second adhesive layer 80, the touch panel 60, the first adhesive layer 50, and the flexible cover plate 20 is cut in a die-cutting fashion, such that on the side, where no flexible printed circuit 30 and the touch flexible printed circuit 70 are arranged, of the foldable display device, the edge of the flexible display panel 10, the edge of the polarizer 100, the edge of the second adhesive layer 80, the edge of the touch panel 60, the edge of the first adhesive layer 50, and the edge of the flexible cover plate 20 are flush with one another.

Referring to FIG. 3 and FIG. 11 again, the flexible display panel 10 further includes a second surface 105, and the second surface 105 and the first surface 102 are two opposite surfaces of the flexible display panel 10. The foldable display device further includes a support plate 90. The support plate 90 includes a third surface 901 and a fourth surface 902 opposite to each other. The third surface 901 is attached to the second surface 105, and the flexible printed circuit 30 is bent to the fourth surface 902 of the support plate 90.

In the embodiments of the present disclosure, the support plate 90 is arranged to support the flexible display panel 10, such that the morphology of the foldable display device in the flat state is ensured.

Referring to FIG. 3 and FIG. 11 again, the support plate 90 is provided with a groove 903, and the groove 903 extends from an edge of the fourth surface 902 towards the middle of the fourth surface 902. The foldable display device further includes a drive circuit disposed in the groove 903. The flexible printed circuit 30 is electrically connected to the drive circuit.

In the embodiments of the present disclosure, the groove 903 extends from the edge of the fourth surface 902 to the middle of the fourth surface 902 to form a third step 904. The drive circuit is arranged in the groove 903, and parts of the flexible printed circuit 30 and of the touch flexible printed circuit 70, which are electrically connected to the drive circuit, are also disposed in the groove 903. Thus, the thickness of the foldable display device is decreased.

In an exemplary embodiment, the support plate 90 is a metal support plate, such that the support performance and the bending performance of the support plate 90 are ensured.

Described above are merely exemplary embodiments of the present disclosure, but are not intended to limit the present disclosure. Any modifications, equivalent replacements, improvements and the like made within the spirit and principles of the present disclosure should be included within the scope of protection of the present disclosure.

What is claimed is:

1. A foldable display device, comprising:
a flexible display panel comprising a first foldable region and a first side edge, wherein the first foldable region comprises a first sub-region, and a part of the first side edge is a boundary of the first sub-region;
a flexible cover plate bonded to a first surface of the flexible display panel and comprising a second foldable region, wherein an orthographic projection of the second foldable region on the first surface is within the first foldable region and is not overlapped with the first sub-region, and the second foldable region is bonded to the first foldable region; and
a flexible printed circuit bonded to the first side edge, wherein an orthographic projection of the flexible printed circuit on the first surface is not overlapped with the second foldable region,
wherein the foldable display device further comprises:
a housing comprising an annular baffle, wherein the annular baffle surrounds an edge of the flexible display panel, and the annular baffle and the flexible cover plate are disposed on a same side face of the flexible display panel; and
a gap is defined between the annular baffle and the flexible display panel, the flexible printed circuit is disposed in the gap, and on the first surface, the orthographic projection of the flexible printed circuit is within an orthographic projection of the annular baffle.

2. The foldable display device according to claim 1, wherein
the flexible cover plate is provided with a notch in an edge thereof, the notch being disposed in an extending direction of the second foldable region; and
the flexible printed circuit comprises two first parts disposed on two sides of the first foldable region respectively in an extending direction of the first side edge;
wherein on the first surface, orthographic projections of the two first parts are at least partially overlapped with orthographic projections of parts, on two sides of the notch respectively, of the flexible cover plate.

3. The foldable display device according to claim 1, wherein the orthographic projection of the flexible printed circuit on the first surface is not overlapped with an orthographic projection of the flexible cover plate on the first surface.

4. The foldable display device according to claim 1, wherein a surface, distal from the flexible display panel, of the flexible cover plate is flush with a surface, distal from the flexible display panel, of the annular plate.

5. The foldable display device according to claim 1, wherein an inner edge of the annular baffle is attached to an edge of the flexible cover plate.

6. The foldable display device according to claim 1, further comprising:
a first adhesive layer disposed between the flexible display panel and the flexible cover plate; wherein an orthographic projection of the first adhesive layer on the first surface is not overlapped with the orthographic projection of the flexible printed circuit on the first surface; and on a side where the first side edge is disposed, an edge of the first adhesive layer protrudes from an edge of the flexible cover plate, the first adhesive layer and the flexible cover plate forms a first step, and the annular baffle is provided with a second step matching the first step.

7. The foldable display device according to claim 1, wherein the housing further comprises:
a bottom plate opposite to the annular baffle; and
a side plate connected between an outer edge of the bottom plate and an outer edge of the annular baffle, wherein the annular baffle, the bottom plate, and the side plate define an accommodation space, and the flexible display panel is disposed in the accommodation space.

8. The foldable display device according to claim 1, further comprising:
a touch panel disposed between the flexible display panel and the flexible cover plate, wherein the touch panel comprises a third foldable region and a second side edge; wherein the third foldable region comprises a second sub-region, and a part of the second side edge is a boundary of the second sub-region; and the orthographic projection of the second foldable region on the first surface is within an orthographic projection of the third foldable region on the first surface, and is not overlapped with an orthographic projection of the second sub-region on the first surface; and
a touch flexible printed circuit bonded to the second side edge, wherein an orthographic projection of the touch flexible printed circuit on the first surface is not overlapped with the orthographic projection of the third foldable region on the first surface.

9. The foldable display device according to claim 1, wherein the flexible display panel further comprises a second surface, wherein the second surface and the first surface are two opposite surfaces of the flexible display panel; and the foldable display device further comprises:
a support plate comprising a third surface and a fourth surface opposite to each other, wherein the third surface is attached to the second surface, and the flexible printed circuit is bent to the fourth surface of the support plate.

10. The foldable display device according to claim 2, further comprising: a touch panel disposed between the flexible display panel and the flexible cover plate, wherein the touch panel comprises a third foldable region and a second side edge; wherein the third foldable region comprises a second sub-region, and a part of the second side edge is a boundary of the second sub-region; and the orthographic projection of the second foldable region on the first surface is within an orthographic projection of the third foldable region on the first surface, and is not overlapped with an orthographic projection of the second sub-region on the first surface; and
a touch flexible printed circuit bonded to the second side edge, wherein an orthographic projection of the touch flexible printed circuit on the first surface is not overlapped with the orthographic projection of the third foldable region on the first surface.

11. The foldable display device according to claim 1, further comprising:
a touch panel disposed between the flexible display panel and the flexible cover plate, wherein the touch panel comprises a third foldable region and a second side edge; wherein the third foldable region comprises a second sub-region, and a part of the second side edge is a boundary of the second sub-region; and the orthographic projection of the second foldable region on the first surface is within an orthographic projection of the third foldable region on the first surface, and is not overlapped with an orthographic projection of the second sub-region on the first surface; and a touch flexible printed circuit bonded to the second side edge, wherein an orthographic projection of the touch flexible printed circuit on the first surface is not overlapped with the orthographic projection of the third foldable region on the first surface.

12. The foldable display device according to claim 1, wherein the flexible display panel further comprises a second surface, wherein the second surface and the first surface are two opposite surfaces of the flexible display panel; and the foldable display device further comprises:

a support plate comprising a third surface and a fourth surface opposite to each other, wherein the third surface is attached to the second surface, and the flexible printed circuit is bent to the fourth surface of the support plate.

13. The foldable display device according to claim 2, wherein a width of the notch is greater than or equal to a width of the second foldable region, and the width of the notch and the width of the second foldable region are dimensions defined in the extending direction of the first side edge.

14. The foldable display device according to claim 2, further comprising:

a housing comprising an annular baffle, wherein the annular baffle surrounds an edge of the flexible display panel, and the annular baffle and the flexible cover plate are disposed on a same side face of the flexible display panel; and a gap is defined between the annular baffle and the flexible display panel, the flexible printed circuit is disposed in the gap, and on the first surface, the orthographic projection of the flexible printed circuit is within an orthographic projection of the annular baffle.

15. The foldable display device according to claim 6, wherein a width of a step surface of the first step ranges from 0.2 mm to 0.5 mm, and the width of the step surface is a dimension defined in a direction perpendicular to the extending direction of the first side edge and parallel to the first surface.

16. The foldable display device according to claim 8, wherein two opposite surfaces of the touch panel are bonded to the touch flexible printed circuit.

17. The foldable display device according to claim 8, wherein the flexible display panel further comprises a second surface, wherein the second surface and the first surface are two opposite surfaces of the flexible display panel; and the foldable display device further comprises:

a support plate comprising a third surface and a fourth surface opposite to each other, wherein the third surface is attached to the second surface, and the flexible printed circuit is bent to the fourth surface of the support plate.

18. The foldable display device according to claim 9, wherein the support plate is provided with a groove, wherein the groove extends from an edge of the fourth surface towards the middle of the fourth surface; and the foldable display device further comprises a drive circuit disposed in the groove, wherein the flexible printed circuit is electrically connected to the drive circuit.

19. The foldable display device according to claim 16, further comprising:

a second adhesive layer disposed between the touch panel and the flexible display panel, wherein an orthographic projection of the second adhesive layer on the first surface is not overlapped with the orthographic projection of the touch flexible printed circuit on the first surface, and on a side where the second side edge is disposed, an edge of the touch panel protrudes from an edge of the second adhesive layer.

\* \* \* \* \*